United States Patent
Chen et al.

(10) Patent No.: US 11,622,471 B2
(45) Date of Patent: Apr. 4, 2023

(54) COOLING METHOD FOR A COLD PLATE MODULE

(71) Applicant: Quanta Computer Inc., Taoyuan (TW)

(72) Inventors: Yi-Chieh Chen, Taoyuan (TW); Yueh-Chang Wu, Taoyuan (TW); Te-Chuan Wang, Taoyuan (TW); Tzu-Hsuan Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 2 days.

(21) Appl. No.: 17/304,704

(22) Filed: Jun. 24, 2021

(65) Prior Publication Data
US 2022/0418154 A1    Dec. 29, 2022

(51) Int. Cl.
*H05K 7/20* (2006.01)
*G06F 1/20* (2006.01)

(52) U.S. Cl.
CPC ........... *H05K 7/20254* (2013.01); *G06F 1/20* (2013.01); *H05K 7/20263* (2013.01); *H05K 7/20272* (2013.01); *G06F 2200/201* (2013.01)

(58) Field of Classification Search
CPC ........... H05K 7/20254; H05K 7/20263; H05K 7/20272; G06F 1/20; G06F 2200/201
See application file for complete search history.

(56) References Cited

U.S. PATENT DOCUMENTS

| 7,325,588 | B2 * | 2/2008 | Malone | H05K 7/20772 |
| | | | | 361/689 |
| 7,336,487 | B1 * | 2/2008 | Chrysler | H01L 23/473 |
| | | | | 361/679.48 |
| 7,431,071 | B2 * | 10/2008 | Wenger | F28D 15/043 |
| | | | | 165/47 |
| 7,703,503 | B2 * | 4/2010 | Sakayori | F28D 15/0275 |
| | | | | 29/890.032 |
| 11,304,343 | B1 * | 4/2022 | Chen | F28F 3/06 |
| 2009/0020260 | A1 * | 1/2009 | Miyagawa | F28D 15/0266 |
| | | | | 165/181 |
| 2009/0225515 | A1 * | 9/2009 | Hom | H05K 7/20781 |
| | | | | 165/181 |
| 2011/0277967 | A1 * | 11/2011 | Fried | F28D 15/0266 |
| | | | | 165/104.26 |
| 2013/0000871 | A1 * | 1/2013 | Olson | H05K 7/20336 |
| | | | | 713/300 |
| 2014/0085817 | A1 * | 3/2014 | Campbell | H05K 7/20772 |
| | | | | 361/689 |

(Continued)

*Primary Examiner* — Stephen S Sul
(74) *Attorney, Agent, or Firm* — Nixon Peabody LLP

(57) ABSTRACT

A cooling device for a computing system is disclosed. The cooling device includes an inlet conduit, a first cold plate, a connecting conduit, a second cold plate, an outlet conduit, and a heat conductor. Coolant flows through the inlet conduit. The first cold plate has a first inlet surface and a first outlet surface. The inlet conduit is coupled to the first inlet surface. The inlet conduit transfers the coolant into the first cold plate. The connecting conduit is coupled at one end to the first outlet surface. The coolant flows from the first cold plate through the connecting conduit. The second cold plate has a second inlet surface and a second outlet surface, the connecting conduit being coupled at another end to the second inlet surface. The outlet conduit is coupled to the second outlet surface. The coolant flows from the second cold plate through the outlet conduit.

9 Claims, 7 Drawing Sheets

(56) References Cited

U.S. PATENT DOCUMENTS

| | | | |
|---|---|---|---|
| 2015/0296661 A1* | 10/2015 | Mari Curbelo | H01L 23/427 165/104.21 |
| 2018/0066663 A1* | 3/2018 | Kulkarni | H05K 7/20772 |
| 2020/0042053 A1* | 2/2020 | Cheng | H05K 7/20336 |
| 2021/0092879 A1* | 3/2021 | Chen | H05K 7/20272 |
| 2022/0210949 A1* | 6/2022 | Edmunds | H05K 7/20272 |

\* cited by examiner

COOLING METHOD FOR A COLD PLATE MODULE

FIELD OF THE INVENTION

The present invention relates generally to a cooling device, and more specifically, to cooling electronic components in a server system.

BACKGROUND OF THE INVENTION

Cooling devices, such as cold plates, typically dissipate heat produced by electronic components in a server system. One such method is using a liquid coolant to aid in transferring the heat from the electronic component to the cooling device. When such a cooling device is used, it is important for the liquid coolant to securely flow within the cooling system and not leak onto any components in the server system. Furthermore, the design of the cooling device may also impact the cooling efficacy of the server system. Another way to assist in the transfer of heat from an area of higher temperature to an area of lower temperature is with the addition of components that promote heat conduction or convection.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a cooling device for a computing system is disclosed. The cooling device includes an inlet conduit, a first cold plate, a connecting conduit, a second cold plate, an outlet conduit, and a heat conductor. Coolant flows through the inlet conduit. The first cold plate has a first inlet surface and a first outlet surface. The inlet conduit is coupled to the first inlet surface. The inlet conduit transfers the coolant into the first cold plate. The connecting conduit is coupled at one end to the first outlet surface. The coolant flows from the first cold plate through the connecting conduit. The second cold plate has a second inlet surface and a second outlet surface, the connecting conduit being coupled at another end to the second inlet surface. The outlet conduit is coupled to the second outlet surface. The coolant flows from the second cold plate through the outlet conduit. The heat conductor is coupled between the first outlet surface and the second inlet surface.

According to a configuration of the above implementation, the heat conductor is parallel to the connecting conduit.

In a further aspect of the above implementation, at least one of the first cold plate and the second cold plate includes an internal flow-channel configuration.

In another aspect of the above implementation, the internal flow-channel configuration is selected from a group consisting of a parallel-channel configuration, a serpentine-channel configuration, and a checkerboard-channel configuration.

According to another configuration of the above implementation, each one of the first cold plate and the second cold plate includes an inlet connector and an outlet connector for connecting to a respective one of the inlet conduit, the connecting conduit, or the outlet conduit.

In a further aspect of the above implementation, a distance A separates the first inlet surface from the second outlet surface and a distance B separating the first outlet surface of the first cold plate from the second inlet surface of the second cold plate. The distance A is smaller than distance B.

In yet a further aspect of the above implementation, at least one of the first cold plate and the second cold plate has a copper base.

In a further aspect of the above implementation, at least one of the first cold plate and the second cold plate has a thermal interface that is directly connected to the heat conductor.

According to a configuration of the above implementation, the thermal interface includes one or more of a grease, a thermal pad, a solder material, or an interference fit.

In yet a further aspect of the above implementation, the first cold plate, the second cold plate, and the heat conductor are enclosed together within a unitary cooling module.

In another aspect of the above implementation, the heat conductor includes one or more of a copper plate, a heat pipe, a vapor chamber, or a thermosiphon.

According to another aspect of the present disclosure, a cooling device for a computing system is disclosed. The cooling device includes a pair of inlet conduits, a first cold plate, a second cold plate, a connecting conduit, and a heat conductor. Coolant flows through the pair of inlet conduits. The pair of inlet conduits includes a first inlet conduit and a second inlet conduit. The first cold plate has a first inlet surface and a first outlet surface. The first inlet conduit is coupled to the first inlet surface. The first inlet conduit transfers the coolant into the first cold plate. The second cold plate has a second inlet surface and a second outlet surface, the connecting conduit being coupled at another end to the second inlet surface. The second inlet conduit is coupled to the second inlet surface. The second inlet conduit transfers the coolant into the second cold plate. The first inlet conduit and the second inlet conduit are at least in part between the first cold plate and the second cold plate. The connecting conduit is coupled at a first end to the first outlet surface. The connecting conduit is coupled at a second end to the second inlet surface. The coolant flows between the first cold plate and the second cold plate through the connecting conduit. The heat conductor is coupled between the first outlet surface and the second outlet surface.

According to a configuration of the above implementation, at least one of the first cold plate and the second cold plate includes an internal flow-channel configuration.

In a further aspect of the above implementation, the internal flow-channel configuration is selected from a group consisting of a parallel-channel configuration, a serpentine-channel configuration, and a checkerboard-channel configuration.

In another aspect of the above implementation, a distance A separates the first inlet surface from the second outlet surface and a distance B separating the first outlet surface of the first cold plate from the second inlet surface of the second cold plate. The distance A is smaller than distance B.

According to another configuration of the above implementation, a change in temperature of the heat conductor ranges between 1° and 15° Celsius after the coolant is cooled.

In a further aspect of the above implementation, a pressure drop of the coolant flowing through the cooling device ranges between 1 and 20 kiloPascals.

In another aspect of the above implementation, a first central processing unit (CPU) is mounted to the first cold plate. A second central processing unit (CPU) is mounted to the second cold plate. A change in temperature between the first CPU and the second CPU ranging between 0.005° and 5° Celsius.

According to a configuration of the above implementation, a case temperature of the second CPU ranges between 40° and 90° Celsius after being cooled.

In a further aspect of the above implementation, at least one of the first cold plate and the second cold plate includes a thermal interface that is directly connected to the heat conductor. The thermal interface includes one or more of a grease, a thermal pad, a solder material, or an interference fit.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
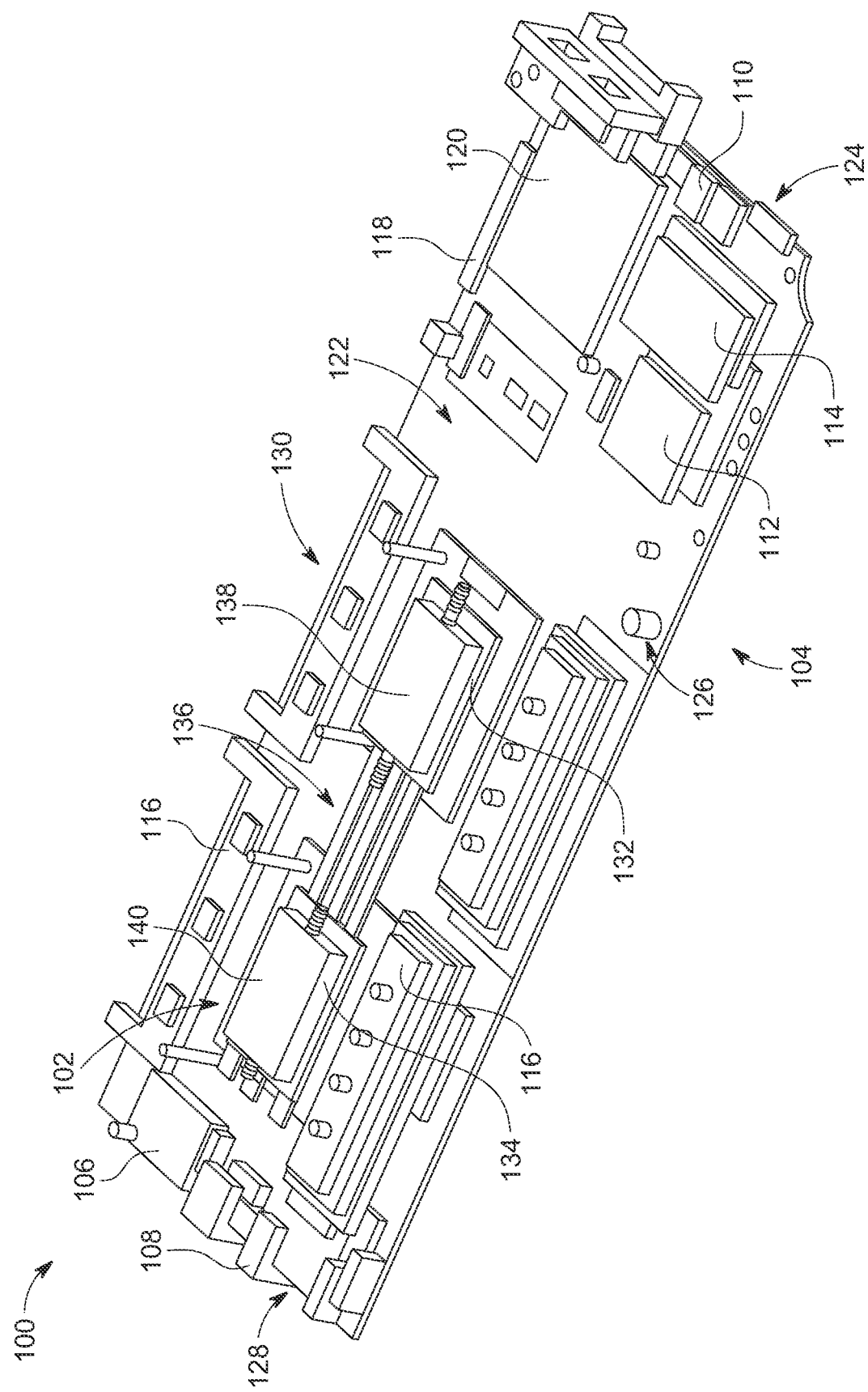
FIG. 1 is a perspective view showing an example cooling system in a chassis of a computing system, according to certain aspects of the present disclosure.

The present disclosure is directed to a cooling device, and more specifically, to a cooling device for cooling electronic components in a server system. The cooling device uses cold plates, a heat conductor, and a liquid coolant to cool both the front and rear the electronic components in an efficient manner. The cold plates and heat conductor assist in transferring heat from the electronic components to the liquid coolant to make the temperature in the flow system more uniform.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a server system 100 is shown with a cooling system 102 in a chassis 104 of the server system 100. The illustrated server system 100 also includes a power supply 106, a serial port 108, an input/output port 110, a platform controller hub 112, a baseboard management controller (BMC) 114, double data rate 4 dual in-line memory modules (DIMM)s 116, a peripheral component interconnect express (PCIe) slot 118, and a network interface controller card 120. In other implementations, the server system 100 may include more than the listed components or less than the listed components. The chassis 104 includes a bottom panel 122, a first section 124, a second section 126, a third section 128, and a fourth section 130 to enclose the electronic components of the server system 100. The first section 124 is generally perpendicular to the second section 126 and the fourth section 130. The first section 124 is generally parallel to the third section 128.

In some implementations, the cooling system 102 includes heat conductors 136 and cold plates 138, 140. The heat conductors 136 may be heat pipes, heat tape, thermosyphon, vapor chambers, copper plates, or other thermal conduction parts. In this implementation, the computer system includes electronic components 132, 134 that may be devices, such as central processing units, other processors, and memory devices. The electronic components 132, 134 generate heat, when in operation. Thus, the cooling system 102 may be used to decrease the temperature at and surrounding the electronic components 132 and 134. The electronic components 132, 134 may be located near the third section 128 of the chassis 104, and in between the second section 126 and the fourth section 130. The electronic components 132, 134 may also be placed on a printed circuit board supported by the bottom panel 122. The cold plates 138, 140 may be coupled on top of the electronic components 132, 134. The heat conductors 136 may be coupled between the cold plates 138, 140 to assist in distributing heat when the second cold plate 140 has a higher temperature than the first cold plate 138. In this implementation, the heat conductors 136 may run approximately parallel with the second section 126 and the fourth section 130. The DIMMs 116 may be located on the second section 126 and the fourth section 130 near the electronic components 132 and 134. The power supply 106 and the serial port 108 may be located near the third section 128. The input/output port 110 may be located near the first section 124. The PCIe slot 118 and the network interface controller card 120 may be located near the first section 124 and the fourth section 130. The platform controller hub 112 and the BMC 114 may be located near the first section 124 and the second section 126.

Figure 2A:
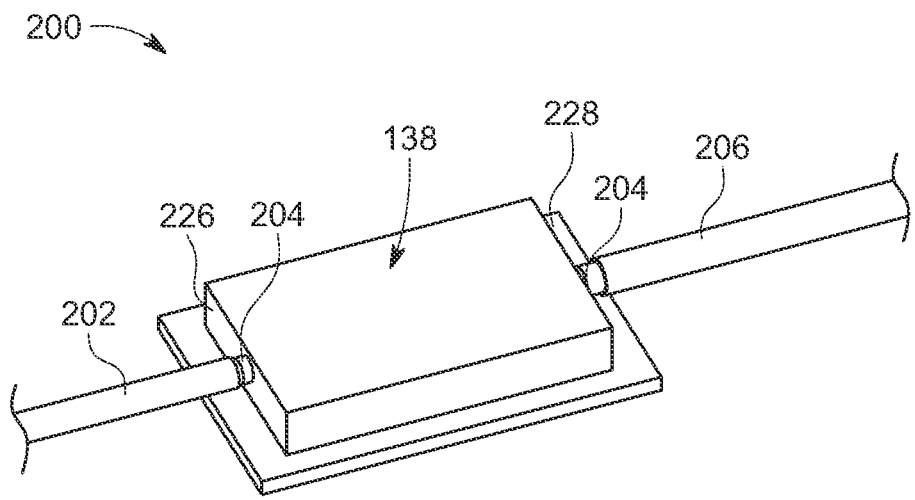
FIG. 2A is a perspective view showing an example conduit connection of a cooling device of the example cooling system in FIG. 1, according to certain aspects of the present disclosure.
Figure 2B:
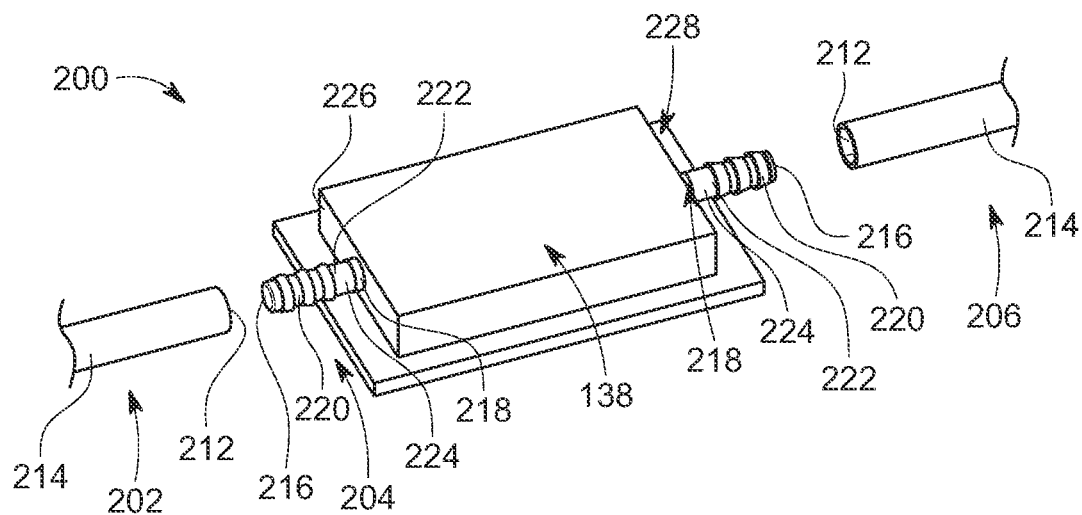
FIG. 2B is an exploded view of the separated components of the example conduit connection in FIG. 2A, according to certain aspects of the present disclosure.

FIG. 2A is a perspective view showing an implementation of the cooling system 200 including the first cold plate 138 coupled to a first conduit 202 and a second conduit 206. FIG. 2B is an exploded view of the first cold plate 138, the first conduit 202, and the second conduit 206 separated. Referring to FIG. 2A, the cold plate 138 has connectors 204 on opposite sides. The first conduit 202 and connectors 204 to fluidly connect the first conduit 202 with the first cold plate 138. As shown, the first conduit 202 and connector 204 are at a first end 226, and the second conduit 206 and the connectors 204 are at a second end 228 of the first cold plate 138.

The first conduit 202 and the second conduit 206 may circulate a liquid coolant through the first cold plate 138 to decrease the temperature at and near the processing unit. More specifically, as liquid coolant travels through the first conduit 202, the temperature inside the first cold plate 138 may be lowered by transferring heat to the liquid coolant supplied by the first conduit 202. As a result, heat may be reduced based on the relatively lower temperature of the first cold plate 138 absorbing the surrounding heat of the components near the first cold plate 138. Such a component may be an electronic component such as the electronic component 132 (shown in FIG. 1) mounted directly under the first cold plate 138.

Referring to FIG. 2B, the conduits 202, 206 are generally tubular with an approximately uniform diameter and hollow interior. The conduits 202, 206 may be made of a material that maintains its shape, such as a metal or cured polymer. The conduits 202, 206 may also be made of a flexible material with a shape that may be manipulated for a modified conduit path. In some implementations, the conduits 202, 206 may include insulative properties in order to maintain the temperature outside of the conduits 202, 206. Alternatively, the conduits 202, 206 may include conductive properties to decrease the temperature outside of the conduits 202, 206. The conduits 202, 206 may also be pipes, channels, hoses, or other tubes. The connector 204 is generally tubular with a hollow interior and varying diameter along the connector 204. The connector 204 may be made of a material that maintains its shape, such as a metal or cured polymer. The connector 204 may generally assist in coupled the first cold plate 138 to the first conduit 202 or the second conduit 206. The connector 204 may be a fitting, adapter, valve, or other type of connector. The conduits 202, 206 and the connector 204 may withstand high temperature and low temperature fluids while maintaining structural integrity.

In this implementation, the first conduit 202 has a connection side 212 and an external side 214. The connector 204 has a first opening 216, a second opening 218, a plurality of protrusions 220, a cap 222, and a plurality of threads 224. The protrusions 220 extend from the first opening 216 to the cap 222. Each protrusion 220 may be considered a barb, such as in the context of barbed fittings. The threads 224 extend from the second opening 218 to the cap 222. Thus, the protrusion 220 holds the conduits 202, 206 in place relative to the connector 204. The connection side 212 of the conduit 202, 206 may encapsulate the first opening 216, and at least some of the protrusions 220 of the connector 204. One or more additional substances may be used to form a seal between the conduits 202, 206 and the connector 204, such as solder, O-rings, tape, adhesive. Thus, liquid coolant passing from the conduits 202, 206 to the connector 204 flows directly and leaking is prevented. Thus, liquid passing from the connector 204 to the first cold plate 138 flows directly, and leaking is prevented.

In this implementation, the cap 222 has five sides. In other implementations, the cap 222 may have more or less than five sides. The outer diameter of the cap 222 is greater than the outer diameter of the protrusions 220 and the threads 224. Thus, the cap 222 may assist a user coupling the conduits 202, 206 and the cold plate 138 to the connector 204, by using a tool or fingers to grip the cap 222 to tighten or loosen the connection.

Figure 3:
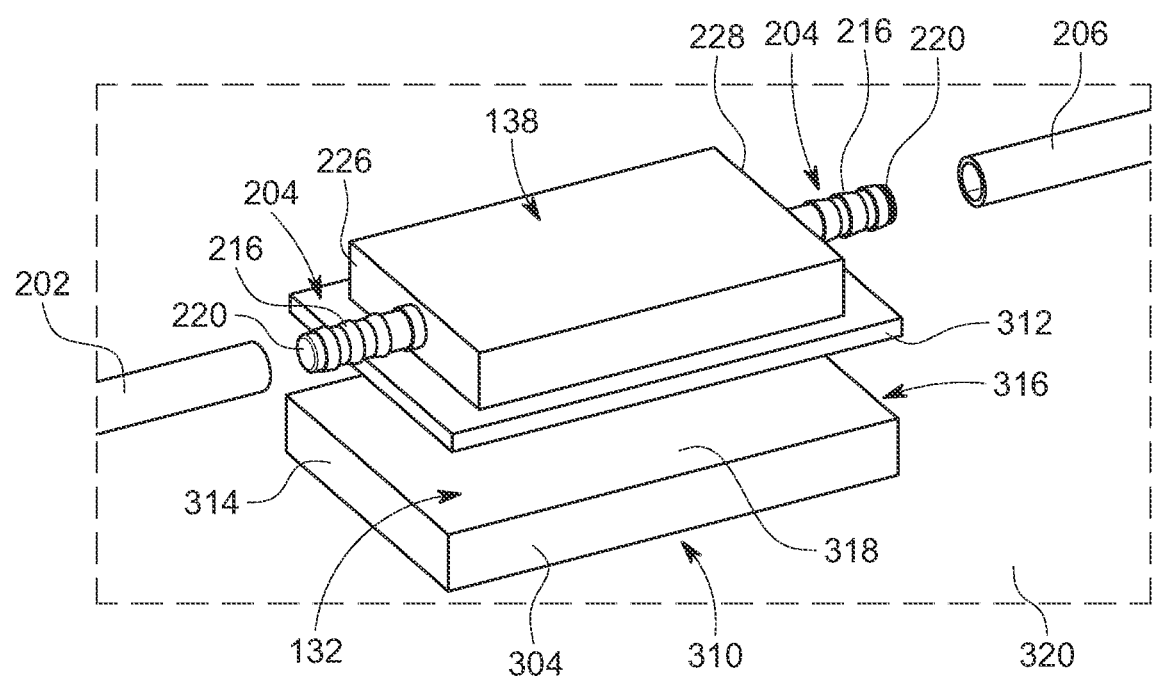
FIG. 3 is a perspective view showing the cold plate of the example cooling system in FIG. 1 separated from an electronic device, according to certain aspects of the present disclosure.

FIG. 3 is a perspective view showing the first cold plate 138 coupled to the electronic component 132. Before installation, the first end 226 of the first cold plate 138 is aligned with a first portion 314 of the electronic component 132. Similarly, the second end 228 of the first cold plate 138 is aligned with a second portion 316 of the electronic component 132. A bottom surface 312 of the first cold plate 138 may contact a top portion 318 of the electronic component 132 to allow thermal transmission. In some implementations, the first cold plate 138 be coupled to the electronic component 132 by a fastener, such as a screw, a nail, an adhesive, a clamp, etc. Similarly, the electronic component 132 may be coupled to a motherboard 320. In other implementations the electronic component 132 may be coupled directly to a chassis. In this implementation, sections of the electronic component 132 include a conductive metal base and a grease, a thermal pad, a solder material, or an interference fit.

Figure 4A:
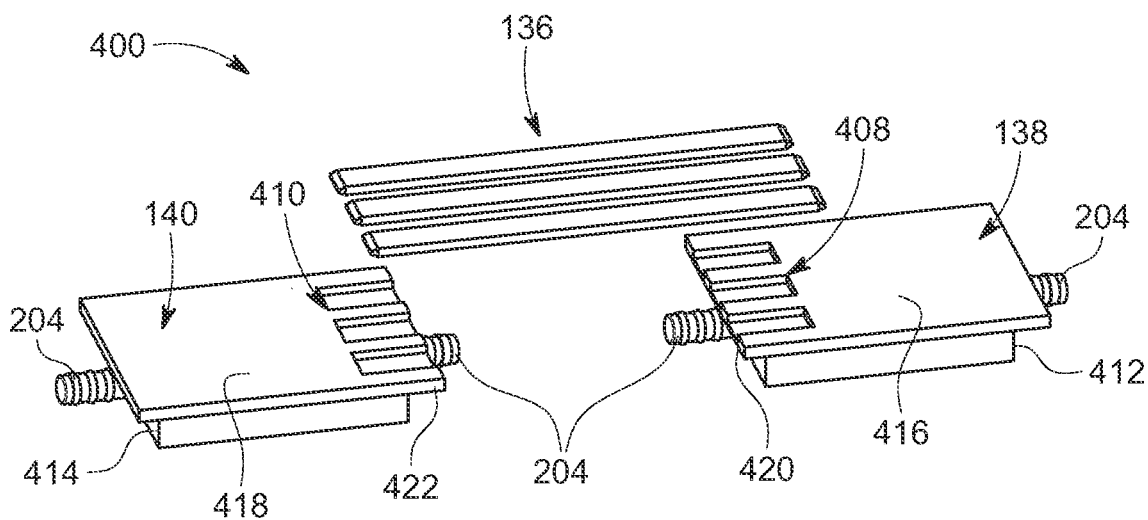
FIG. 4A is a bottom perspective view showing a conduit and two cold plates of the example cooling system in FIG. 1, according to certain aspects of the present disclosure.
Figure 4B:
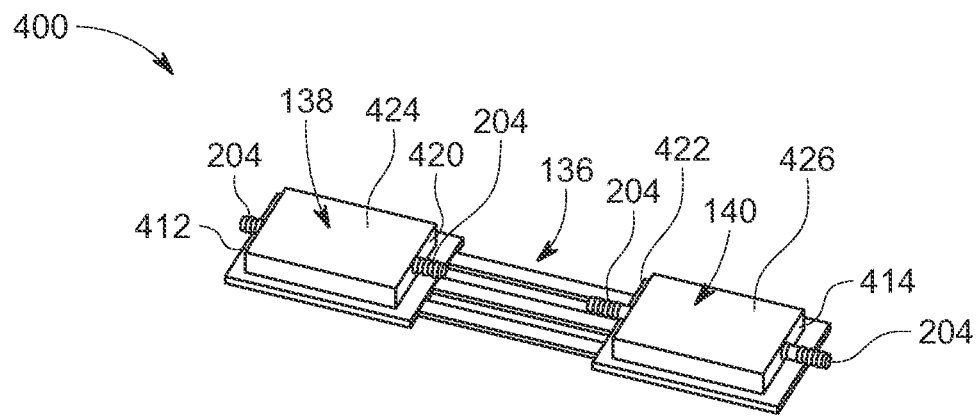
FIG. 4B is a top perspective view showing an example conduit connecting two cold plates in FIG. 1, according to certain aspects of the present disclosure.
Figure 4C:
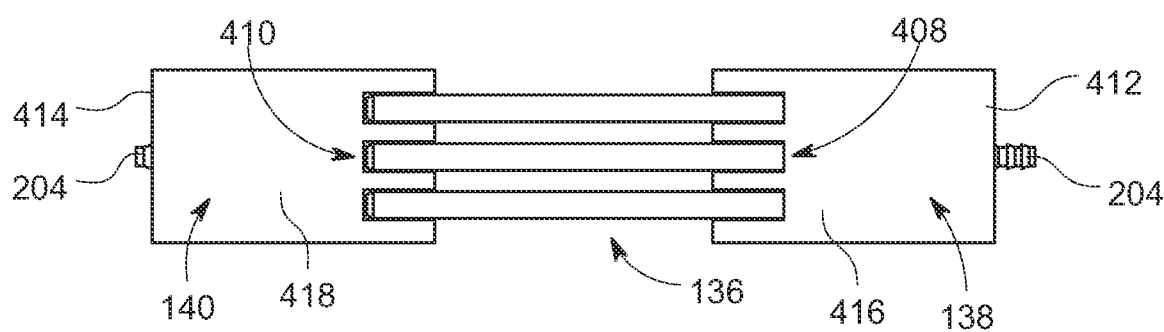
FIG. 4C is a bottom view showing the example conduit connecting two cold plates in FIG. 4B, according to certain aspects of the present disclosure.

FIGS. 4A-4C show a cooling device 400. FIG. 4A is a bottom perspective view of the cooling device 400. The set of heat conductors 136 are coupled between the first cold plate 138 and the second cold plate 140. The first cold plate 138 has a first base plate 416. A first set of grooves 408 is positioned near a first inlet surface 420 of the first base plate 416. Similarly, a second set of grooves 410 is positioned near a second outlet surface 422 on a second base plate 418 of the second cold plate 140. Each groove 408, 410 extends from the first and second base plates 416, 418 toward the connector 204, but the grooves 408, 410 do not abut the connector 204. Each groove in the first set of grooves 408 also extends from the first inlet surface 420 toward a first outlet surface 412. Similarly, each groove in the second set of grooves 410 also extends from the second outlet surface 422 toward a second inlet surface 414. In this implementation, there are three grooves in each set of grooves 408, 410. In other implementations, there may be more or less than three grooves in each set of grooves 408, 410.

The heat conductors 136 may be heat pipes, heat tape, thermosyphon, vapor chambers, copper plates, or other thermal conduction parts. The heat conductors 136 may assist in distributing heat when the second cold plate 140 has a higher temperature than the first cold plate 138. The extra heat on the second cold plate 140 may be transferred to the first cold plate 138 through the heat conductors 136 to be cooled by using thermal conduction and phase transition.

In some implementations, there may be a liquid contained in an interior void in the heat conductor 136, when the heat conductor 136 is a heat pipe. In such implementations, the liquid on a portion having a higher temperature transitions into a gas by absorbing heat from the hotter surface. The gas then travels along in the heat conductor 136 to a cooler portion and condenses back into a liquid, releasing latent heat. As the cycle repeats, the liquid travels to a portion of higher temperature through a mechanism such as gravity, centrifugal force, or capillary action. Thus, the heat conductor 136 effectively transfers heat to cool one or more components. Each of the heat conductors 136 are approximately the same length and width. The width of the heat conductor 136 is less than the width of the corresponding grooves 408, 410. The length of the heat conductors 136 may vary depending upon needs of the system.

FIG. 4B a top perspective view of the cooling device 400 with the heat conductors 136 coupled to the first cold plate 138 and the second cold plate 140. In this implementation, the length of heat conductors 136 is minimized such that the distance between the first cold plate 138 and the second cold plate 140 is near to zero.

FIG. 4C is a bottom view of the cooling device 400. As shown, the heat conductors 136 is seated within each groove in the first set of grooves 408 and the second set of grooves 410. The heat conductors 136 may be coupled to the sets of grooves 408, 410 using soldering, embedding, riveting, bolting, brazing, or another method to join the components. In this implementation, the heat conductors 136 are soldered to the sets of grooves 408, 410.

After the heat conductors 136 are joined to the sets of grooves 408, 410, the first base plate 416 and the second base plate 418 may be smoothened, such that the first base plate 416 and the second base plate 418 are flat surfaces. The connectors 204 are adjacent to the heat conductors 136 such that the connectors 204 are located closer to a first top plate 424 and a second top plate 426 than the heat conductors 136. The first cold plate 138 has a first inlet connector and the second cold plate 140 has a second inlet connector.

Figure 5:
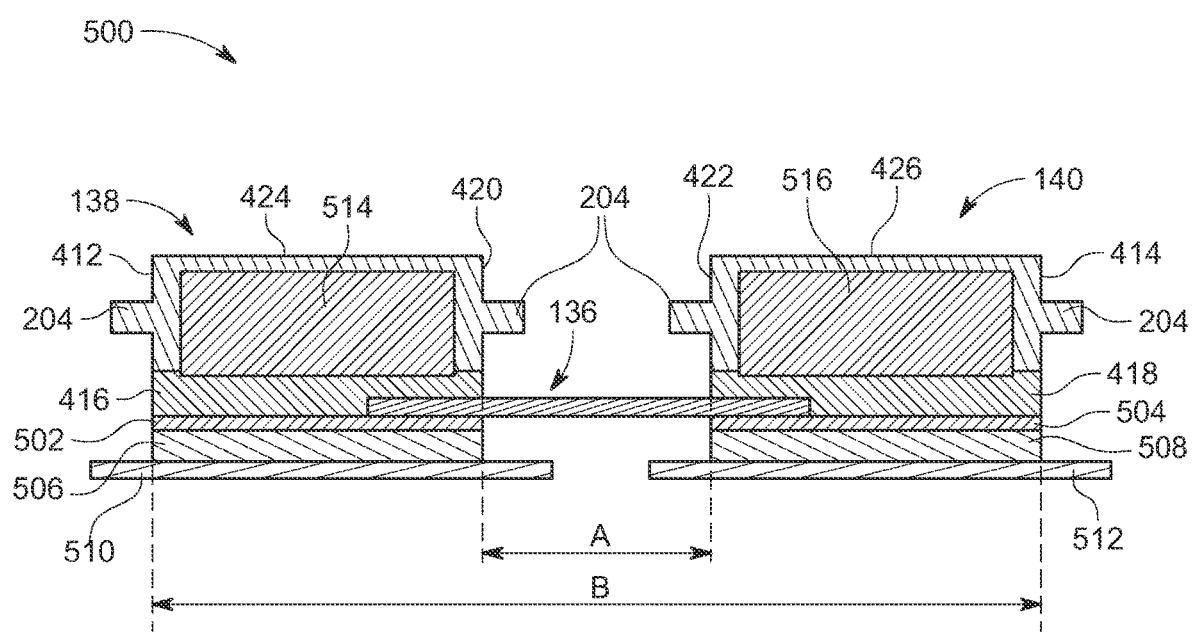
FIG. 5 is a cross-sectional view showing components of an example conduit connecting two cold plates in FIG. 1, according to certain aspects of the present disclosure.

FIG. 5 is a cross-sectional view showing components of the first cold plate 138 and the second cold plate 140. Referring to FIG. 5, after the heat conductors 136 are added to the first cold plate 138 and the second cold plate 140, additional sections may be added to a cooling assembly 500. The first base plate 416 and the second base plate 418 are coupled to the heat conductors 136. The first cold plate 138, the second cold plate 140, and the heat conductor 136 are enclosed together within a unitary cooling module. In this implementation, one side of the first base plate 416 and the second base plate 418 abuts the first top plate 424 and the second top plate 426, respectively. The first top plate 424 of the first cold plate 138 includes a first fin 514 extending into the interior of the cold plate 138 to assist in decreasing temperature. Similarly, the second cold plate 140 includes a second fin 516 extending from the second top plate 426 to assist in decreasing temperature.

The first base plate 416 abuts a first thermal interference 502 on a side opposite the first top plate 424. Similarly, the second base plate 418 abuts a second thermal interference 504 on an opposite side from the second top plate 426. The heat conductors 136 are in direct contact with the first thermal interference 502 and the second thermal interference 504. The first thermal interference 502 abuts a first electronic component 132. Similarly, the second thermal interference 504 abuts a second electronic component 134. The first electronic component 132 is located on a first part 510 of a motherboard. The second electronic component 134 is located on a second part 512 of a motherboard. A distance A separates the first inlet surface 420 from the second outlet surface 422 and a distance B separating the first outlet surface 412 of the first cold plate 138 from the second inlet surface 414 of the second cold plate 140. The distance A may be smaller than the di stance B.

As liquid coolant travels from the first cold plate 138 to the second conduit 206 (shown in FIG. 2) and into the second cold plate 140, the temperature inside the second cold plate 140 is lowered by transferring heat to the liquid coolant supplied by the second conduit 206 (shown in FIG. 2). As a result, heat may be reduced based on the relatively lower temperature of the second cold plate 140 absorbing the surrounding heat of the components near the second cold plate 140. The heated liquid coolant is circulated to an external heat exchanger or coolant supply (not shown) that removes the heat and recirculates the cooled liquid coolant through the first conduit 202 (shown in FIG. 2). The process continues while the first conduit 202 (shown in FIG. 2) and the second conduit 206 (shown in FIG. 2) are in use, circulating the liquid coolant to cool the system.

The first and second base plates 416, 418 may be made of a conductive metal, such as copper or aluminum, and are shaped generally as a rectangular prism. The fins 514, 516 may be louvered, lanced offset, straight, wavy, or another type of fin that is positioned within the first and second base plates 416, 418. Additionally, the fins 514, 516 may define an internal parallel channel, a serpentine channel, or a checkerboard channel flow configuration on the interior of the cold plates 138 and 140 to internally direct the liquid coolant. Thus, the first and second cold plates 138, 140 include an internal flow-channel configuration. Liquid coolant may flow into one connector 204 on the base plates 416, 418, through the fins 514, 516, and out of the other connector 204. The first and second thermal interferences 502, 504 may be thermal pads, grease, paste, interference, solder, compound, or another substance to ensure thermal contact between the first and second base plates 416, 418 and the first and second processing units 506, 508. The first and second processing units 506, 508 may be a central processing unit, a graphics processing unit, a digital signal processor, a sound chip/card, a vision processing unit, or other type of processing unit in an integrated circuit package.

Figure 6:
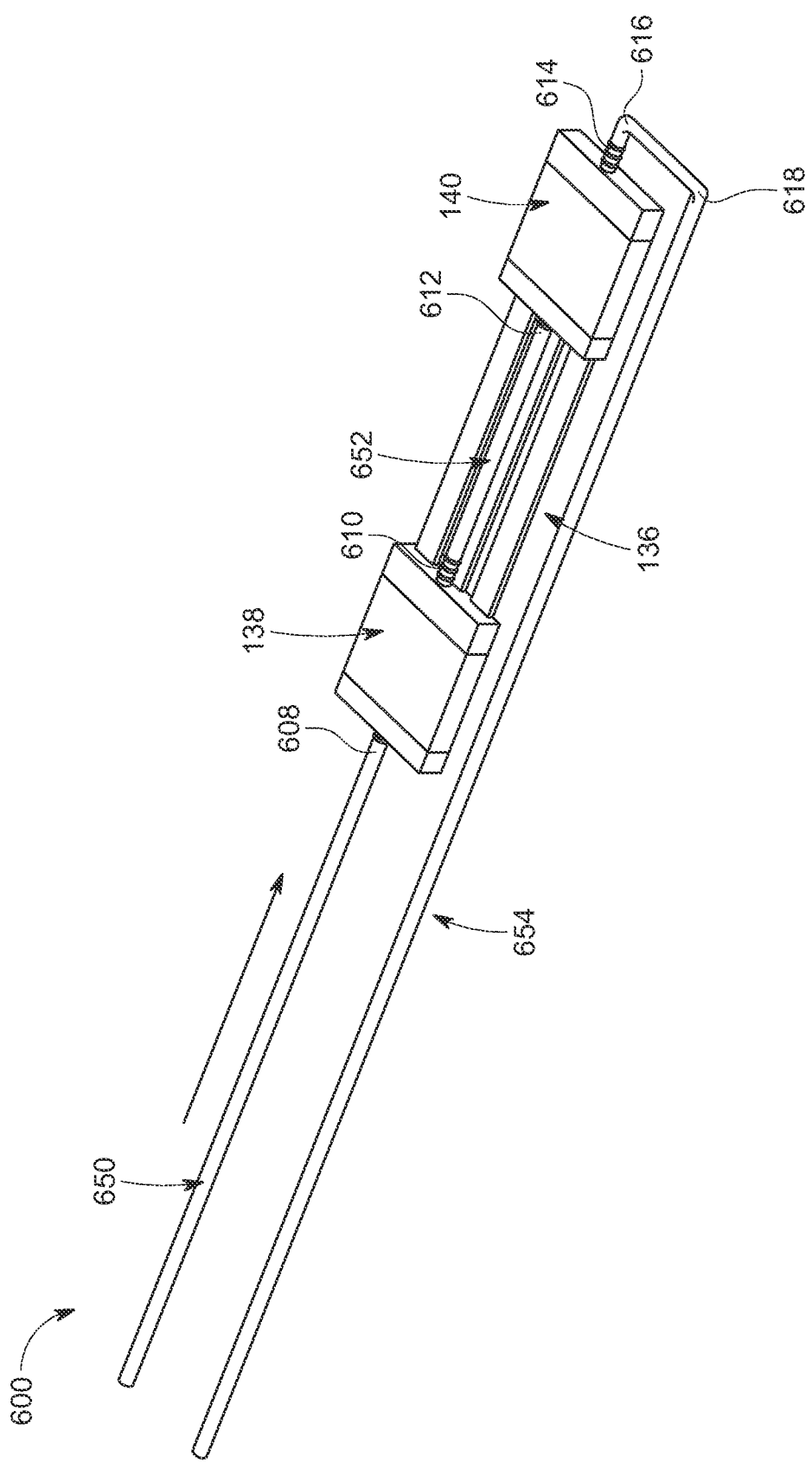
FIG. 6 is a perspective view showing an example conduit design with a straight conduit design and heat conductor, according to certain aspects of the present disclosure.

The first and second processing units 506, 508 may generate, produce, or radiate heat and, thus, increase surrounding temperature. In some implementations, when the cooling assembly 500 is in use in a straight conduit design (as shown in FIG. 6), a change in temperature between the first and second processing units 506, 508 may range between 1° and 15° Celsius, for example the first processing unit 506 may be 7.3° Celsius cooler than the second processing unit 508, with a case temperature of the second processing unit 508 ranging between 40° and 90° Celsius after being cooled, for example, 66.7° Celsius. A change in temperature of the heat conductor 136 after the liquid coolant is cooled may range between 0.005° and 5° Celsius, for example 0.4° Celsius. A pressure drop of the liquid coolant flowing through the components may range between 1 and 20 kiloPascals, for example 7.0 kiloPascals.

Figure 7:
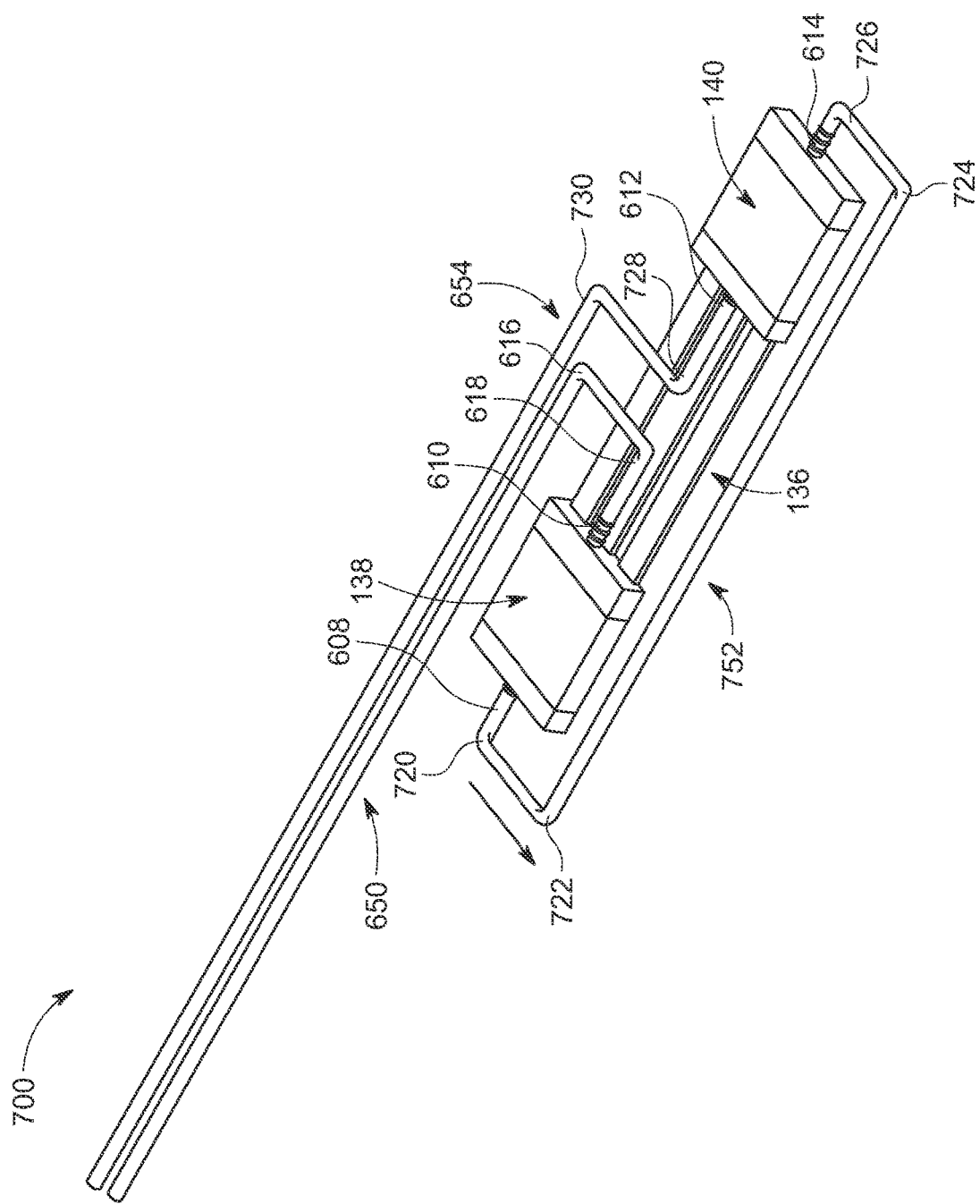
FIG. 7 is a perspective view showing an example conduit design with a serpentine conduit design and heat conductor, according to certain aspects of the present disclosure.

In other implementations, when the cooling assembly 500 is in use a serpentine conduit design (as shown in FIG. 7), a change in temperature between the first and second processing units 506, 508 may range between 0.005° and 5° Celsius, for example the first processing unit 506 may be 0.1° Celsius cooler than the second processing unit 508, with a case temperature of the second processing unit 508 ranging between 40° and 90° Celsius after being cooled, for example 60.2° Celsius. A change in temperature of the heat conductor 136 may range between 1° and 15° Celsius after the liquid coolant is cooled, for example 6.0° Celsius. A pressure drop of the liquid coolant flowing through the components may range between 1 and 20 kiloPascals, for example 9.8 kiloPascals. In other implementations, the cooling assembly 500 exhibit different characteristics with a different conduit design.

FIG. 6 is a perspective view of an implementation of a cooling system 600 may have a straight conduit design. The cooling system 600 includes a first cold plate 138, a second cold plate 140, a heat conductor 136, an inlet conduit 650, an internal connecting conduit 652, and an outlet conduit 654. The heat conductor 136 is coupled to the first cold plate 138 and the second cold plate 140. The first cold plate 138 has a first connection 608 and a second connection 610. The second cold plate 140 has a third connection 612 and a fourth connection 614. All four connections 608, 610, 612, 614 include a connection device, such as the connector 204, shown in FIG. 2. The inlet conduit 650 is coupled to the first cold plate 138 at the first connection 608, and the first connection 608 may contain an inlet connector. The internal connecting conduit 652 is coupled to the first cold plate 138 at the second connection 610, and to the second cold plate 140 at the third connection 612. Thus, the second connection 610 and the third connection 612 may contain an internal conduit connector. The outlet conduit 654 is coupled to the second cold plate 140 at the fourth connection 614, and the fourth connection 614 may contain an outlet connector.

The outlet conduit 654 may have a first bent portion 616 and a second bent portion 618 to ensure that the outlet conduit 654 is efficiently placed in a server system. In other implementations, the outlet conduit 654 may have more or less than two bent portions. Similarly, the inlet conduit 650 may have one or more bent portions. The first and second cold plates 138, 140 are each designed to be placed above a processing unit, such as the processing unit described in FIG. 5, which may dissipate, generate, produce, or radiate heat. Thus, the cooling system 600 is used as a cooling mechanism.

The inlet conduit 650, the internal connecting conduit 652, and the outlet conduit 654 may circulate a liquid coolant to decrease the temperature at and near the processing unit. More specifically, as liquid coolant travels through the inlet conduit 650, the temperature inside the first cold plate 138 may be lowered by transferring heat to the liquid coolant supplied by the inlet conduit 650. As a result, heat in an electronic component may be reduced based on the relatively lower temperature of the first cold plate 138 absorbing the surrounding heat of the components near the first cold plate 138. Such a component may be an electronic component mounted directly under the first cold plate 138. In a similar manner, as the liquid coolant travels from the first cold plate 138 to the internal connecting conduit 652, and into the second cold plate 140, the temperature inside the second cold plate 140 is lowered by transferring heat to the liquid coolant supplied by the internal connecting conduit 652. As a result, heat may be reduced based on the relatively lower temperature of the second cold plate 140, which absorbs the surrounding heat of the components near the second cold plate 140. The outlet conduit 654 then removes the heated liquid coolant from the absorbed heat out of the second cold plate 140. The heated liquid coolant is circulated to an external heat exchanger or coolant supply (not shown) that removes the heat and recirculates the cooled liquid coolant through the inlet conduit 650. The process continues while the inlet conduit 650 and the outlet conduit 654 are in use, circulating the liquid coolant to cool the system.

FIG. 7 is a perspective view of an implementation of a cooling system 700 may include a serpentine conduit design. The cooling system 700 includes a first cold plate 138, a second cold plate 140, a heat conductor 136, an inlet conduit 650, an external connecting conduit 752, and an outlet conduit 654. The heat conductor 136 is coupled to the first cold plate 138 and the second cold plate 140. The first cold plate 138 has a first connection 608 and a second connection 610. The second cold plate 140 has a third connection 612 and a fourth connection 614. All four connections 608, 610, 612, 614 include a connection device, such as the connector 204, shown in FIG. 2. The inlet conduit 650 is coupled to the first cold plate 138 at the second connection 610, and the second connection 610 may contain an inlet conduit connector. The external connecting conduit 752 is coupled to the first cold plate 138 at the first connection 608, and to the second cold plate 140 at the fourth connection 614. Thus, the first connection 608 and the fourth connection 614 may contain external outlet connectors. The outlet conduit 654 is coupled to the second cold plate 140 at the third connection 612, and the third connection 612 may contain an outlet conduit connector.

The inlet conduit 650 may have a first bent portion 616 and a second bent portion 618. The external connecting conduit 752 may have a third bent portion 720, a fourth bent portion 722, a fifth bent portion 724, and a sixth bent portion 726. The outlet conduit 654 may have a seventh bent portion 728 and an eighth bent portion 730. Each bent portion may ensure that the corresponding conduit is efficiently placed in a server system and around other components. The first and second cold plates 138, 140 are each designed to be placed above a processing unit, such as the processing unit described in FIG. 5, which may dissipate, generate, produce, or radiate heat. Thus, the cooling system 700 is used as a cooling mechanism.

The inlet conduit 650, the external connecting conduit 752, and the outlet conduit 654 may circulate a liquid coolant to decrease the temperature at and near the processing unit. More specifically, as liquid coolant travels through the inlet conduit 650, the temperature inside the first cold plate 138 may lower by transferring heat to the liquid coolant supplied by the inlet conduit 650. As a result, heat may be reduced based on the relatively lower temperature of the first cold plate 138, which absorbs the surrounding heat of the components near the first cold plate 138. In a similar manner, as the liquid coolant travels from the first cold plate 138 through the external connecting conduit 752 and into the second cold plate 140, the temperature inside the second cold plate 140 may be lowered by transferring heat to the liquid coolant supplied by the external connecting conduit 752. As a result, heat may be reduced based on the relatively lower temperature of the second cold plate 140, which absorbs the surrounding heat of the components near the second cold plate 140. The outlet conduit 654 then removes the heated liquid coolant from the absorbed heat out of the second cold plate 140. The heated liquid coolant is circulated to an external heat exchanger or coolant supply (not shown) that removes the heat and recirculates the cooled liquid coolant through the inlet conduit 650. The process continues while the inlet conduit 650 and the outlet conduit 654 are in use, circulating the liquid coolant to cool the system.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A cooling device for a computing system, the cooling device comprising:
   an inlet conduit through which a coolant flows;
   a first cold plate having a first inlet surface and a first outlet surface, the inlet conduit being coupled to the first inlet surface, the inlet conduit transferring the coolant into the first cold plate;
   a connecting conduit coupled at one end to the first outlet surface, the coolant flowing from the first cold plate through the connecting conduit;
   a second cold plate having a second inlet surface and a second outlet surface, the connecting conduit being coupled at another end to the second inlet surface;
   an outlet conduit coupled to the second outlet surface, the coolant flowing from the second cold plate through the outlet conduit; and
   a heat conductor coupled between the first outlet surface and the second inlet surface;
   wherein each one of the first cold plate and the second cold plate includes an inlet connector and an outlet connector for connecting to a respective one of the inlet conduit, the connecting conduit, or the outlet conduit; and
   wherein a distance A separates the first inlet surface from the second outlet surface, a distance B separating the first outlet surface of the first cold plate from the second inlet surface of the second cold plate, the distance A being smaller than distance B.

2. The cooling device of claim 1, wherein the heat conductor is parallel to the connecting conduit.

3. The cooling device of claim 1, wherein at least one of the first cold plate and the second cold plate includes an internal flow-channel configuration.

4. The cooling device of claim 3, wherein the internal flow-channel configuration is selected from a group consisting of a parallel-channel configuration, a serpentine-channel configuration, and a checkerboard-channel configuration.

5. The cooling device of claim 1, wherein at least one of the first cold plate and the second cold plate has a copper base.

6. The cooling device of claim 1, wherein at least one of the first cold plate and the second cold plate includes a thermal interface that is directly connected to the heat conductor.

7. The cooling device of claim 6, wherein the thermal interface includes one or more of a grease, a thermal pad, a solder material, or an interference fit.

8. The cooling device of claim 1, wherein the first cold plate, the second cold plate, and the heat conductor are enclosed together within a unitary cooling module.

9. The cooling device of claim 1, wherein the heat conductor includes one or more of a copper plate, a heat pipe, a vapor chamber, or a thermosiphon.

* * * * *